(12) United States Patent
Doll et al.

(10) Patent No.: US 7,903,403 B2
(45) Date of Patent: Mar. 8, 2011

(54) AIRFLOW INTAKE SYSTEMS AND ASSOCIATED METHODS FOR USE WITH COMPUTER CABINETS

(75) Inventors: Wade J. Doll, Seattle, WA (US); Brian F. Hawkins, Lynnwood, WA (US)

(73) Assignee: Cray Inc., Seattle, WA (US)

(*) Notice: Subject to any disclaimer, the term of this patent is extended or adjusted under 35 U.S.C. 154(b) by 0 days.

(21) Appl. No.: 12/253,692

(22) Filed: Oct. 17, 2008

(65) Prior Publication Data

US 2010/0097752 A1    Apr. 22, 2010

(51) Int. Cl.
*H05K 7/20* (2006.01)

(52) U.S. Cl. ............ 361/679.5; 361/679.49; 361/679.48; 361/690; 361/695

(58) Field of Classification Search .................. 361/690, 361/695, 679.48, 679.49, 679.5, 687
See application file for complete search history.

(56) References Cited

U.S. PATENT DOCUMENTS

| | | |
|---|---|---|
| 2,628,018 A | 2/1953 | Koch |
| 2,673,721 A | 3/1954 | Dickinson |
| 2,861,782 A | 11/1958 | Swartz |
| 3,120,166 A | 2/1964 | Lyman |
| 3,192,306 A | 6/1965 | Skonnord |
| 3,236,296 A | 2/1966 | Dubin |
| 3,317,798 A | 5/1967 | Chu et al. |
| 3,348,609 A | 10/1967 | Dubin et al. |
| 3,525,385 A | 8/1970 | Liebert |
| 3,559,728 A | 2/1971 | Lyman et al. |
| 3,648,754 A | 3/1972 | Sephton |
| 3,903,404 A | 9/1975 | Beall et al. |
| 3,942,426 A | 3/1976 | Binks et al. |
| 4,016,357 A | 4/1977 | Abrahamsen |
| 4,158,875 A | 6/1979 | Tajima et al. |
| 4,261,519 A | 4/1981 | Ester |
| 4,270,362 A | 6/1981 | Lancia et al. |
| 4,271,678 A | 6/1981 | Liebert |
| 4,306,613 A | 12/1981 | Christopher |
| 4,313,310 A | 2/1982 | Kobayashi et al. |
| 4,315,300 A | 2/1982 | Parmerlee et al. |
| 4,386,651 A | 6/1983 | Reinhard |
| 4,449,579 A | 5/1984 | Miyazaki et al. |
| 4,458,296 A | 7/1984 | Bryant et al. |
| 4,473,382 A | 9/1984 | Cheslock |

(Continued)

FOREIGN PATENT DOCUMENTS

JP    2004079754    3/2004

(Continued)

OTHER PUBLICATIONS

U.S. Appl. No. 11/958,114, filed Dec. 17, 2007, Yatskov.

(Continued)

*Primary Examiner* — Anatoly Vortman
(74) *Attorney, Agent, or Firm* — Perkins Coie LLP

(57) ABSTRACT

Airflow intake systems for use with computer cabinet air conditioning systems are disclosed herein. In one embodiment, a computer system includes a plurality of computer modules and an associated air mover positioned in an interior portion of a computer cabinet. The computer cabinet includes an opening that provides access to the interior portion. In this embodiment, a door or other panel is positioned in front of the opening and is at least partially offset from the opening to define a gap between the panel and the cabinet. Operation of the air mover draws cooling air into the cabinet through the gap, and then drives the cooling air through the cabinet to cool the computer modules.

20 Claims, 8 Drawing Sheets

U.S. PATENT DOCUMENTS

| | | | |
|---|---|---|---|
| 4,513,351 A | 4/1985 | Davis et al. | |
| 4,528,614 A | 7/1985 | Shariff et al. | |
| 4,535,386 A | 8/1985 | Frey, Jr. et al. | |
| 4,642,715 A | 2/1987 | Ende | |
| 4,644,443 A | 2/1987 | Swensen et al. | |
| 4,691,274 A | 9/1987 | Matouk et al. | |
| 4,702,154 A | 10/1987 | Dodson | |
| 4,728,160 A * | 3/1988 | Mondor et al. | 312/236 |
| 4,767,262 A | 8/1988 | Simon | |
| 4,774,631 A | 9/1988 | Okuyama et al. | |
| 4,797,783 A | 1/1989 | Kohmoto et al. | |
| 4,798,238 A | 1/1989 | Ghiraldi | |
| 4,860,163 A | 8/1989 | Sarath | |
| 4,874,127 A | 10/1989 | Collier | |
| 4,901,200 A | 2/1990 | Mazura | |
| 4,911,231 A | 3/1990 | Horne et al. | |
| 4,993,482 A | 2/1991 | Dolbear et al. | |
| 5,000,079 A | 3/1991 | Mardis | |
| 5,019,880 A | 5/1991 | Higgins, III | |
| 5,035,628 A | 7/1991 | Casciotti et al. | |
| 5,060,716 A | 10/1991 | Heine | |
| 5,090,476 A | 2/1992 | Immel | |
| 5,101,320 A | 3/1992 | Bhargava et al. | |
| 5,131,233 A | 7/1992 | Cray et al. | |
| 5,150,277 A | 9/1992 | Bainbridge et al. | |
| 5,161,087 A | 11/1992 | Frankeny et al. | |
| 5,165,466 A | 11/1992 | Arbabian | |
| 5,196,989 A | 3/1993 | Zsolnay | |
| 5,263,538 A | 11/1993 | Amidieu et al. | |
| 5,273,438 A | 12/1993 | Bradley et al. | |
| 5,297,990 A | 3/1994 | Renz et al. | |
| 5,323,847 A | 6/1994 | Koizumi et al. | |
| 5,326,317 A | 7/1994 | Ishizu et al. | |
| 5,329,425 A | 7/1994 | Leyssens et al. | |
| 5,339,214 A | 8/1994 | Nelson | |
| 5,345,779 A | 9/1994 | Feeney | |
| 5,365,402 A | 11/1994 | Hatada et al. | |
| 5,376,008 A | 12/1994 | Rodriguez | |
| 5,395,251 A | 3/1995 | Rodriguez et al. | |
| 5,402,313 A | 3/1995 | Casperson et al. | |
| 5,410,448 A | 4/1995 | Barker, III et al. | |
| 5,414,591 A * | 5/1995 | Kimura et al. | 361/695 |
| 5,467,250 A | 11/1995 | Howard et al. | |
| 5,467,609 A | 11/1995 | Feeney | |
| 5,471,850 A | 12/1995 | Cowans | |
| 5,491,310 A | 2/1996 | Jen | |
| 5,493,474 A | 2/1996 | Schkrohowsky et al. | |
| 5,547,272 A * | 8/1996 | Paterson et al. | 312/223.2 |
| 5,572,403 A | 11/1996 | Mills | |
| 5,603,375 A | 2/1997 | Salt | |
| 5,684,671 A * | 11/1997 | Hobbs et al. | 361/679.57 |
| 5,685,363 A | 11/1997 | Orihira et al. | |
| 5,707,205 A | 1/1998 | Otsuka et al. | |
| 5,709,100 A | 1/1998 | Baer et al. | |
| 5,718,628 A | 2/1998 | Nakazato et al. | |
| 5,749,702 A | 5/1998 | Datta et al. | |
| 5,782,546 A | 7/1998 | Iwatare | |
| 5,793,610 A | 8/1998 | Schmitt et al. | |
| 5,829,676 A | 11/1998 | Ban et al. | |
| 5,880,931 A | 3/1999 | Tilton et al. | |
| 5,927,386 A | 7/1999 | Lin | |
| 5,979,541 A | 11/1999 | Saito | |
| 6,021,047 A * | 2/2000 | Lopez et al. | 361/727 |
| 6,026,565 A | 2/2000 | Giannatto et al. | |
| 6,034,870 A | 3/2000 | Osborn et al. | |
| 6,039,414 A * | 3/2000 | Melane et al. | 312/205 |
| 6,046,908 A | 4/2000 | Feng | |
| 6,052,278 A * | 4/2000 | Tanzer et al. | 361/679.33 |
| 6,104,608 A * | 8/2000 | Casinelli et al. | 361/692 |
| 6,115,242 A | 9/2000 | Lambrecht | |
| 6,132,171 A | 10/2000 | Fujinaka et al. | |
| 6,135,875 A | 10/2000 | French | |
| 6,158,502 A | 12/2000 | Thomas | |
| 6,164,369 A | 12/2000 | Stoller | |
| 6,167,948 B1 | 1/2001 | Thomas | |
| 6,182,787 B1 | 2/2001 | Kraft et al. | |
| 6,183,196 B1 | 2/2001 | Fujinaka | |
| 6,185,098 B1 | 2/2001 | Benavides | |
| 6,205,796 B1 | 3/2001 | Chu et al. | |
| 6,208,510 B1 | 3/2001 | Trudeau et al. | |
| 6,236,564 B1 | 5/2001 | Fan | |
| 6,272,012 B1 | 8/2001 | Medin et al. | |
| 6,305,180 B1 | 10/2001 | Miller et al. | |
| 6,310,773 B1 | 10/2001 | Yusuf et al. | |
| 6,332,946 B1 | 12/2001 | Emmett et al. | |
| 6,351,381 B1 | 2/2002 | Bilski et al. | |
| 6,359,779 B1 | 3/2002 | Frank, Jr. et al. | |
| 6,361,892 B1 | 3/2002 | Ruhl et al. | |
| 6,396,684 B2 * | 5/2002 | Lee | 361/679.49 |
| 6,416,330 B1 | 7/2002 | Yatskov et al. | |
| 6,435,266 B1 | 8/2002 | Wu | |
| 6,439,340 B1 | 8/2002 | Shirvan | |
| 6,462,944 B1 | 10/2002 | Lin | |
| 6,481,527 B1 | 11/2002 | French et al. | |
| 6,501,652 B2 | 12/2002 | Katsui | |
| 6,515,862 B1 | 2/2003 | Wong et al. | |
| 6,519,955 B2 | 2/2003 | Marsala | |
| 6,524,064 B2 | 2/2003 | Chou et al. | |
| 6,546,998 B2 | 4/2003 | Oh et al. | |
| 6,550,530 B1 | 4/2003 | Bilski | |
| 6,554,697 B1 | 4/2003 | Koplin | |
| 6,557,357 B2 | 5/2003 | Spinazzola et al. | |
| 6,557,624 B1 | 5/2003 | Stahl et al. | |
| 6,564,571 B2 | 5/2003 | Feeney | |
| 6,564,858 B1 | 5/2003 | Stahl et al. | |
| 6,582,192 B2 | 6/2003 | Tseng | |
| 6,587,340 B2 | 7/2003 | Grouell et al. | |
| 6,609,592 B2 | 8/2003 | Wilson | |
| 6,628,520 B2 * | 9/2003 | Patel et al. | 361/696 |
| 6,631,078 B2 | 10/2003 | Alcoe et al. | |
| 6,644,384 B2 | 11/2003 | Stahl | |
| 6,661,660 B2 | 12/2003 | Prasher et al. | |
| 6,679,081 B2 | 1/2004 | Marsala | |
| 6,684,457 B2 | 2/2004 | Holt | |
| 6,690,576 B2 | 2/2004 | Clements et al. | |
| 6,705,625 B2 | 3/2004 | Holt et al. | |
| 6,714,412 B1 | 3/2004 | Chu et al. | |
| 6,724,617 B2 | 4/2004 | Amaike et al. | |
| 6,742,068 B2 * | 5/2004 | Gallagher et al. | 710/302 |
| 6,745,579 B2 | 6/2004 | Spinazzola et al. | |
| 6,755,280 B2 | 6/2004 | Porte et al. | |
| 6,761,212 B2 | 7/2004 | DiPaolo | |
| 6,772,604 B2 | 8/2004 | Bash et al. | |
| 6,775,137 B2 | 8/2004 | Chu et al. | |
| 6,776,707 B2 | 8/2004 | Koplin | |
| 6,796,372 B2 | 9/2004 | Bear | |
| 6,819,563 B1 | 11/2004 | Chu et al. | |
| 6,836,407 B2 | 12/2004 | Faneuf et al. | |
| 6,854,287 B2 | 2/2005 | Patel et al. | |
| 6,854,659 B2 | 2/2005 | Stahl et al. | |
| 6,860,713 B2 | 3/2005 | Hoover | |
| 6,867,966 B2 | 3/2005 | Smith et al. | |
| 6,875,101 B1 * | 4/2005 | Chien | 454/184 |
| 6,876,549 B2 * | 4/2005 | Beitelmal et al. | 361/692 |
| 6,881,898 B2 | 4/2005 | Baker et al. | |
| 6,882,531 B2 | 4/2005 | Modica | |
| 6,904,968 B2 | 6/2005 | Beitelmal et al. | |
| 6,909,611 B2 | 6/2005 | Smith et al. | |
| 6,914,780 B1 | 7/2005 | Shanker et al. | |
| 6,932,443 B1 | 8/2005 | Kaplan et al. | |
| 6,975,510 B1 | 12/2005 | Robbins et al. | |
| 6,992,889 B1 | 1/2006 | Kashiwagi et al. | |
| 6,997,245 B2 | 2/2006 | Lindemuth et al. | |
| 6,997,741 B2 | 2/2006 | Doll et al. | |
| 6,999,316 B2 | 2/2006 | Hamman | |
| 7,016,191 B2 * | 3/2006 | Miyamoto et al. | 361/679.33 |
| 7,051,802 B2 | 5/2006 | Baer | |
| 7,051,946 B2 | 5/2006 | Bash et al. | |
| 7,059,899 B2 | 6/2006 | Doll et al. | |
| 7,120,017 B2 | 10/2006 | Shieh | |
| 7,120,027 B2 | 10/2006 | Yatskov et al. | |
| 7,123,477 B2 | 10/2006 | Coglitore et al. | |
| 7,144,320 B2 | 12/2006 | Turek et al. | |
| 7,152,418 B2 | 12/2006 | Alappat et al. | |
| 7,154,748 B2 | 12/2006 | Yamada | |
| 7,177,156 B2 | 2/2007 | Yatskov et al. | |
| 7,182,208 B2 | 2/2007 | Tachibana | |

| | | |
|---|---|---|
| 7,187,549 B2 | 3/2007 | Teneketges et al. |
| 7,193,846 B1 | 3/2007 | Davis et al. |
| 7,193,851 B2 | 3/2007 | Yatskov |
| 7,209,351 B2 | 4/2007 | Wei |
| 7,215,552 B2 | 5/2007 | Shipley et al. |
| 7,218,516 B2 * | 5/2007 | Yu et al. ............... 361/695 |
| 7,226,353 B2 | 6/2007 | Bettridge et al. |
| 7,242,579 B2 | 7/2007 | Fernandez et al. |
| 7,255,640 B2 | 8/2007 | Aldag et al. |
| 7,259,963 B2 | 8/2007 | Germagian et al. |
| 7,286,351 B2 | 10/2007 | Campbell et al. |
| 7,304,842 B2 | 12/2007 | Yatskov |
| 7,314,113 B2 | 1/2008 | Doll |
| 7,315,448 B1 | 1/2008 | Bash et al. |
| 7,330,350 B2 | 2/2008 | Hellriegel et al. |
| 7,362,571 B2 | 4/2008 | Kelley et al. |
| 7,385,810 B2 | 6/2008 | Chu et al. |
| 7,397,661 B2 | 7/2008 | Campbell et al. |
| 7,411,785 B2 | 8/2008 | Doll |
| 7,418,825 B1 | 9/2008 | Bean, Jr. |
| 7,430,118 B1 | 9/2008 | Noteboom et al. |
| 7,513,923 B1 | 4/2009 | Lewis et al. |
| 7,542,287 B2 | 6/2009 | Lewis, II et al. |
| 7,554,803 B2 | 6/2009 | Artman et al. |
| 7,710,720 B2 | 5/2010 | Fuke et al. |
| 2001/0052412 A1 | 12/2001 | Tikka |
| 2002/0041484 A1 * | 4/2002 | Lajara et al. ............... 361/687 |
| 2002/0072809 A1 | 6/2002 | Zuraw |
| 2002/0172007 A1 | 11/2002 | Pautsch |
| 2002/0181200 A1 | 12/2002 | Chang |
| 2003/0010477 A1 | 1/2003 | Khrustalev et al. |
| 2003/0033135 A1 | 2/2003 | Kempe |
| 2003/0053293 A1 * | 3/2003 | Beitelmal et al. ............ 361/687 |
| 2003/0056941 A1 | 3/2003 | Lai et al. |
| 2003/0161102 A1 | 8/2003 | Lee et al. |
| 2003/0183446 A1 | 10/2003 | Shah et al. |
| 2004/0008491 A1 | 1/2004 | Chen |
| 2004/0020225 A1 | 2/2004 | Patel et al. |
| 2004/0052052 A1 | 3/2004 | Rivera |
| 2004/0250990 A1 | 12/2004 | Schaper |
| 2005/0120737 A1 | 6/2005 | Borror et al. |
| 2005/0161205 A1 | 7/2005 | Ashe et al. |
| 2005/0162834 A1 | 7/2005 | Nishimura |
| 2005/0168945 A1 | 8/2005 | Coglitore |
| 2005/0186070 A1 | 8/2005 | Zeng et al. |
| 2005/0207116 A1 | 9/2005 | Yatskov et al. |
| 2005/0225936 A1 | 10/2005 | Day |
| 2005/0241810 A1 | 11/2005 | Malone et al. |
| 2006/0018094 A1 | 1/2006 | Robbins et al. |
| 2006/0044758 A1 | 3/2006 | Spangberg |
| 2006/0054380 A1 * | 3/2006 | Doll ............... 181/225 |
| 2006/0102322 A1 | 5/2006 | Madara et al. |
| 2006/0180301 A1 | 8/2006 | Baer |
| 2007/0030650 A1 | 2/2007 | Madara et al. |
| 2007/0211428 A1 | 9/2007 | Doll |
| 2008/0018212 A1 | 1/2008 | Spearing et al. |
| 2008/0078202 A1 | 4/2008 | Luo |
| 2008/0092387 A1 | 4/2008 | Campbell et al. |
| 2008/0098763 A1 | 5/2008 | Yamaoka |
| 2008/0158814 A1 | 7/2008 | Hattori |
| 2008/0216493 A1 | 9/2008 | Lin et al. |

FOREIGN PATENT DOCUMENTS

| | | |
|---|---|---|
| WO | WO-0186217 | 11/2001 |
| WO | WO-2005027609 | 3/2005 |

OTHER PUBLICATIONS

U.S. Appl. No. 12/029,124, filed Feb. 11, 2008, Kelley et al.
U.S. Appl. No. 12/060,377, filed Apr. 1, 2008, Doll.
U.S. Appl. No. 12/253,672, filed Oct. 17, 2008, Doll et al.
Baer, D.B., "Emerging Cooling Requirements & Systems in Telecommunications Spaces," Telecommunications Energy Conference 2001, Oct. 14-18, 2001, pp. 95-100.
Bleier, F. P., "FAN Handbook, Selection, Application, and Design," McGraw Hill, 1998, pp. 7.50-7.51.
"Frequently Asked Questions about Heat Pipes," Thermacore International, Inc., http://www.thermacore.com/hpt_faqs.htm, 3 pages [accessed Jun. 14, 2004].
Hannemann, R. et al., "Pumped Liquid Multiphase Cooling," ASME, Nov. 2004, IMECE 2004, Paper IMECE2004-60669, Anaheim, CA, 5 pages.
Novel Concepts, Inc., "Heat Spreaders," http://www.novelconceptsinc.com/heat-spreaders.htm, 2 pages [accessed Jun. 14, 2004].
JAMSTEC/Earth Simulator Center, "Processor Node (PN) Cabinet," http://www.es.jamstec.go.jp/esc/eng/Hardware/pnc.html, 1 page, [accessed Mar. 5, 2004].
"Managing Extreme Heat Cooling Strategies for High-Density Computer Systems," Liebert Corporation, Dec. 7, 2003, Columbus, OH, 16 pages.
Marsala, J., "Pumped Liquid/Two Phase Cooling for High Performance Systems," Thermal Form & Function LLC, May 13, 2003, Scottsdale, AA, 19 pages.
Pitasi, M. "Thermal Management System Using Pumped Liquid R-134a with Two Phase Heat Transfer," Thermal Form & Function LLC, Manchester, MA, Mar. 2002, pp. 1-9, http://www.coolingzone.com/Guest/News/NL_MAR_2002/TFF/Tff.html.
"Therma-base-Heat Sink," Thermacore Thermal Management Solutions, pp. 1-3, [accessed Jun. 14, 2005].
Thermal Form & Function LLC, "Box/Blade Cooling System," http://www.thermalformandfunction.com/boxsystem.html, Manchester, MA, 2005, 1 page [accessed May 10, 2006].
"Thermal Form & Function—Rack Cooling System (RCS)," Thermal Form & Function LLC, 2005, Manchester, MA, one page, http://www.thermalformandfunction.com/racksystem.html, [accessed May 11, 2006].
Vogel, M. et al., "Low Profile Heat Sink Cooling Technologies for Next Generation CPU Thermal Designs," *Electronic Cooling Online*, Feb. 17, 2005, 11 pages.
Webb, W., "Take the heat: Cool that hot embedded design," *EDN*, May 13, 2004, 5 pages.
Non-Final Office Action for U.S. Appl. No. 11/371,272, Mail Date Mar. 19, 2009, 13 pages.
U.S. Appl. No. 12/763,977, filed Apr. 20, 2010, Doll.
Non-Final Office Action for U.S. Appl. No. 11/958,114, Mail Date Aug. 25, 2009, 22 pages.
Non-Final Office Action for U.S. Appl. No. 12/060,377, Mail Date Sep. 23, 2009, 10 pages.

* cited by examiner

AIRFLOW INTAKE SYSTEMS AND ASSOCIATED METHODS FOR USE WITH COMPUTER CABINETS

TECHNICAL FIELD

The following disclosure relates generally to air conditioning systems for computer cabinets and, more particularly, to airflow intake systems for computer cabinet air conditioning systems.

BACKGROUND

Supercomputers and other large computer systems typically include a large number of computer cabinets placed next to each other in rows or banks. This arrangement conserves floor space and increases computational speed by reducing cable lengths between cabinets. FIG. 1, for example, illustrates a portion of a prior art supercomputer system 100 having plurality of computer cabinets 110 arranged in a bank. Each of the computer cabinets 110 includes a plurality of computer module compartments 118 (identified individually as a first module compartment 118a, a second module compartment 118b, and a third module compartment 118c) which are accessible via a door 116. Each module compartment 118 holds a plurality of computer modules 112. The computer modules 112 are positioned in close proximity to each other to conserve space and increase computational speed. Each of the computer modules 112 can include a number of processors, routers, and other electronic devices mounted to a motherboard for data and/or power transmission.

Many of the fast processing devices and other electronic devices typically found in supercomputers generate considerable heat during operation. This heat can damage the device and/or degrade performance if not adequately dissipated. Consequently, supercomputers typically include both active and passive cooling systems to maintain device temperatures at acceptable levels.

In the supercomputer system 100, for example, each of the computer cabinets 110 carries a fan 120 that draws cooling air into the cabinet 110 through an inlet 114 in a lower portion of the door 116. The inlet 114 can include a plurality of holes, louvers, or other suitable openings 122 that permit room air to enter the fan 120 without excessive pressure losses. The fan 120 moves the cooling air upwardly through the module compartments 118 to cool the computer modules 112, before exiting through an outlet 124 at the top of the cabinet 110.

One shortcoming of the prior art supercomputer system 100 is that the fan 120 can generate relatively high noise levels during operation. This noise emanates from the inlet 114, and can make working in the vicinity of the computer cabinets 110 uncomfortable and difficult, especially for an 8-hour day or other extended period of time. Moreover, in some instances the noise can exceed regulations that require noise levels of less than, for example, 90 db in the vicinity people working for eight hours or more.

Some computer cabinet air inlets include sound absorbing louvers or baffles to reduce fan noise. While this approach may reduce some of the noise, conventional louver/baffle arrangements are generally insufficient to adequately reduce the typical sound power levels. Moreover, using conventional labyrinth-type louvers for increased sound absorption is often counterproductive, because such louvers tend to create unacceptably high pressure losses across the air inlet.

DETAILED DESCRIPTION

The following disclosure describes several embodiments of airflow intake systems for use with computer cabinet air conditioning systems. Some of the airflow intake systems described herein include offset doors or panels that create efficient inlet paths while reducing ambient noise caused by fans or other internal air movers. Specific details of several embodiments of the invention are described below with reference to FIGS. 2A-7 to provide a thorough understanding of the embodiments. Other details describing well-known structures and systems often associated with computer cabinets and associated air conditioning systems, however, are not set forth below to avoid unnecessarily obscuring the description of the various embodiments. Accordingly, those of ordinary skill in the art will understand that the invention may have other embodiments in addition to those described below. Such embodiments may include other elements and features in addition to those described below, or they may lack one or more of the features or elements described below.

In the Figures, identical reference numbers identify identical or at least generally similar elements. To facilitate the discussion of any particular element, the most significant digit or digits of any reference number refer to the Figure in which that element is first introduced. Element 210, for example, is first introduced and discussed with reference to FIG. 2.

Figure 1:
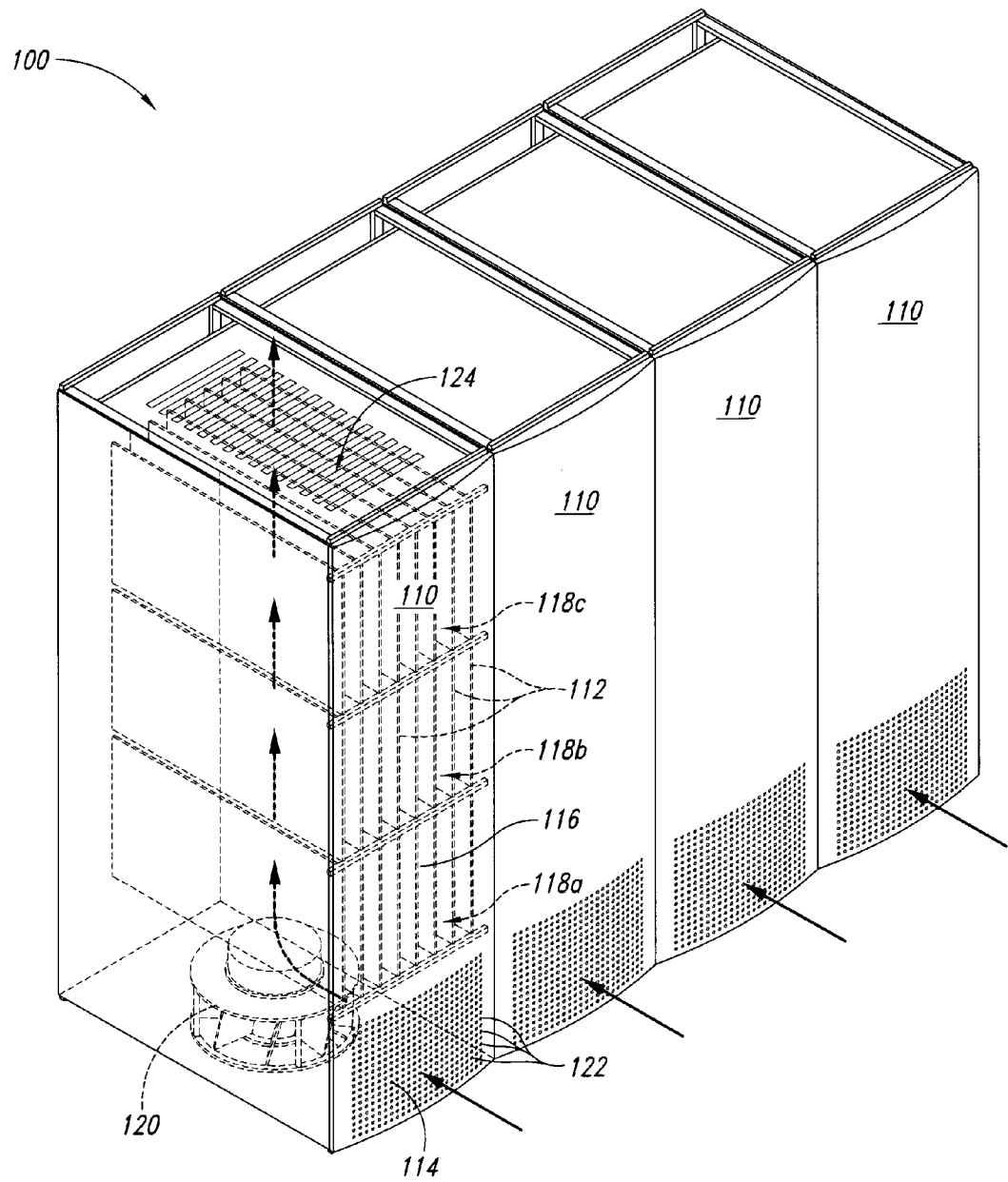
FIG. 1 is an isometric view of a bank of computer cabinets having cooling fan inlets configured in accordance with the prior art.
Figure 2A:
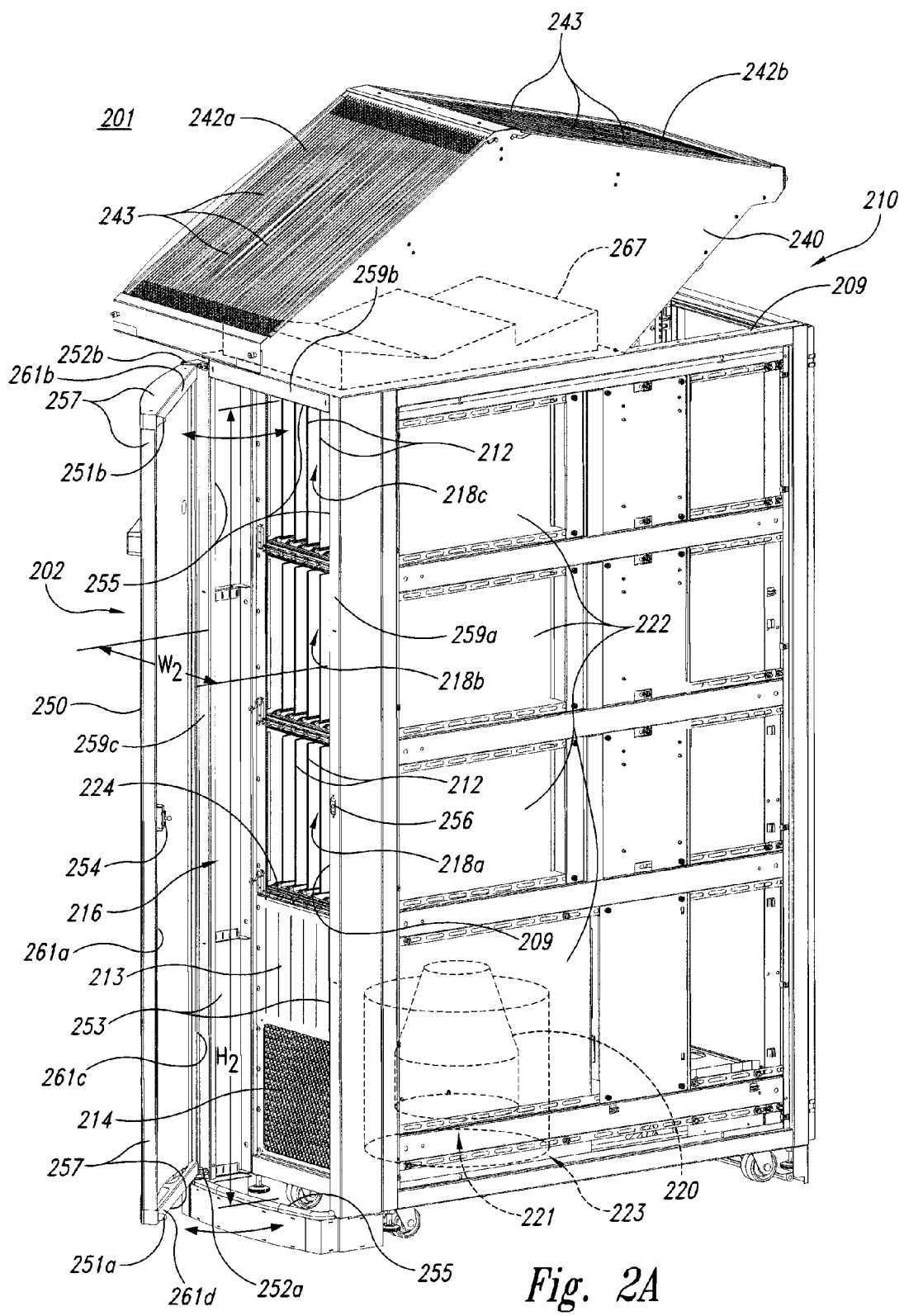
FIGS. 2A and 2B are isometric views of a computer cabinet having a cooling air intake system configured in accordance with an embodiment of the invention.
Figure 2B:
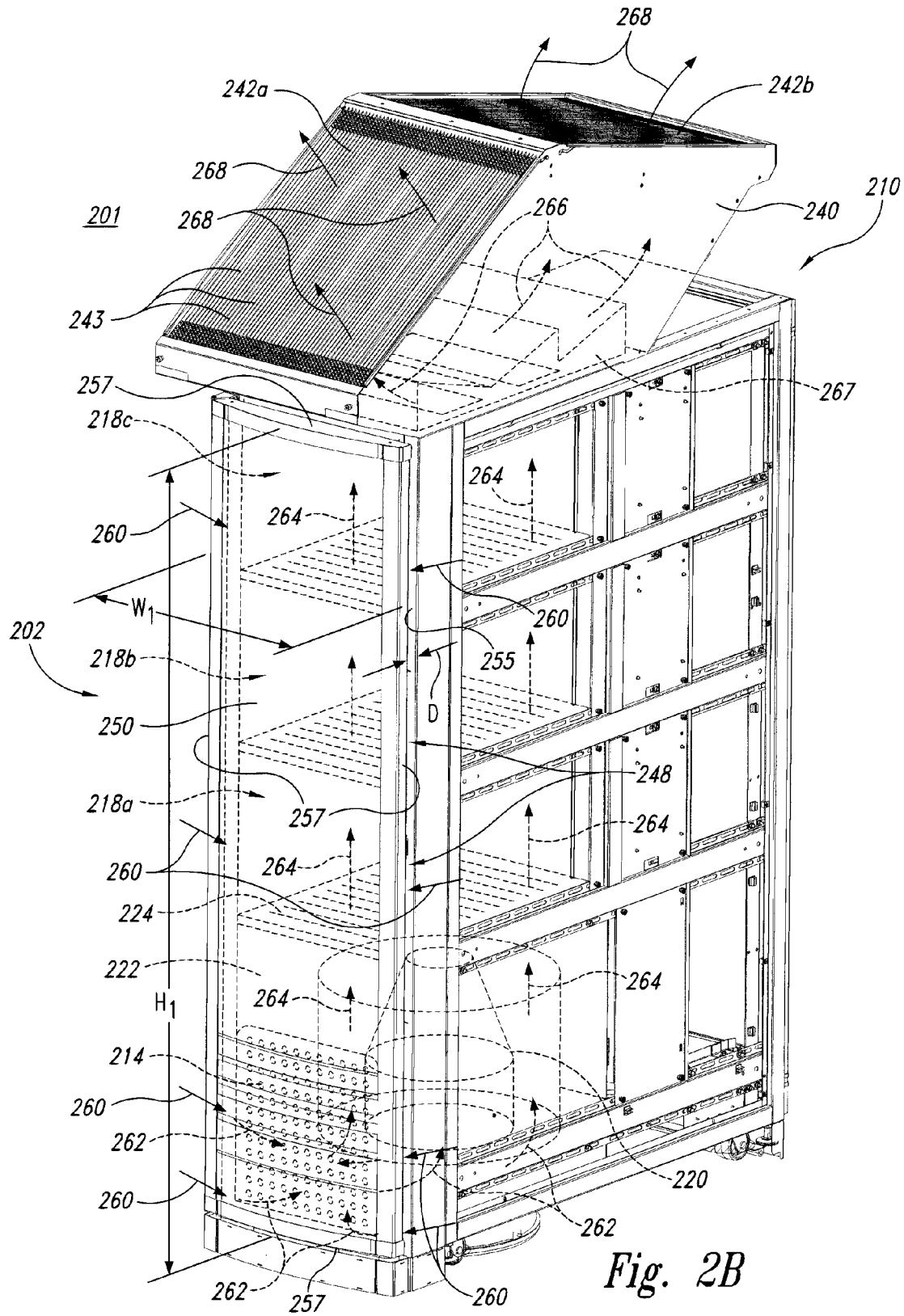

FIGS. 2A and 2B are isometric views of a computer cabinet 210, such as a computer cabinet for use with a supercomputer system, having an airflow intake system 202 configured in accordance with an embodiment of the invention. Referring first to FIG. 2A, the computer cabinet 210 can include a plurality of sidewall portions 222 forming an enclosure around a plurality of computer module compartments 218 (identified individually as a first computer module compartment 218a, a second computer module compartment 218b, and a third computer module compartment 218c) arranged vertically in a chassis 209. Each of the computer module compartments 218 can hold a plurality of computer modules 212 in edgewise, vertical orientation. The computer modules 212 are arranged in close proximity to each other but with air gaps or channels therebetween.

An air handler or air mover 220 (e.g., a fan, axial flow fan, impellor fan, single stage fan, multi-stage fan, etc.) is positioned in a plenum 223 beneath the computer module compartments 218 and behind an access panel 213. In the illustrated embodiment, the access panel 213 includes an air inlet 214 having a screen, louvers, or other type of perforated surface that allows air to pass into the plenum 223 and then into an intake 221 of the air mover 220.

In the illustrated embodiment, the computer cabinet 210 can include an inlet air heat exchanger 224 positioned between the air mover 220 and the first computer module compartment 218a. Although not shown in detail, the inlet heat exchanger 224 can include a plurality of cooling fins configured to carry working fluid (e.g., a refrigerant, coolant, water, etc.). The cooling fins can be spaced apart from each other to create openings through which air can pass. As the air flows upwardly through the openings, the working fluid absorbs heat from the air, thereby cooling the air before it moves to the first module compartment 218a. In other embodiments, an intercooler or other heat exchanger could also be positioned between each of the other computer module compartments 218. In yet further embodiments, the inlet heat exchanger 224 and/or one or more of the other intercoolers or heat exchangers can be omitted. In some embodiments, the inlet heat exchanger 224 (and/or the other intercoolers if used) can be at least generally similar in structure and function to one or more of the heat exchangers described in detail in U.S. patent application Ser. Nos. 10/805,875, 11/958,114, 12/029,124, and 12/060,377; and/or in U.S. Pat. Nos. 7,330,350 and 7,411,785, each of which is incorporated herein in its entirety by reference.

The computer cabinet 210 can optionally include an overhead heat exchanger 240 for cooling air exiting the third computer module compartment 218c before it flows into a surrounding room 201. A flow element 267 can optionally be positioned above the third computer module compartment 218c to distribute the air flowing into the overhead heat exchanger 240 from the cabinet 210. The overhead heat exchanger 240 can include one or more heat exchanging portions 242 (identified individually as a first heat exchanging portion 242a and a second heat exchanging portion 242b). Each of the heat exchanging portions 242 include a plurality of spaced-apart heat exchanging elements 243 that circulate coolant, such as a refrigerant, water, etc. In some embodiments, the overhead heat exchanger 240, the heat exchanging portions 242, and/or the flow element 267 can be at least generally similar in structure and function to the corresponding structures described in detail in U.S. patent application Ser. No. 12/253,672, filed concurrently herewith and entitled "AIR CONDITIONING SYSTEMS FOR COMPUTER SYSTEMS AND ASSOCIATED METHODS," which is incorporated herein in its entirety by reference.

A panel or cabinet door 250 is movably positioned in front of an opening 216 that provides access to the computer module compartments 218 and the access panel 213. In this embodiment, the opening 216 has an outer periphery 255 defined by a door frame 253. The door frame 253 can include a plurality of exterior surface portions 259a-c defining, or at least partially defining, a peripheral edge portion of the opening 216. The door 250 has an outer periphery 257, and includes a plurality of interior surface portions 261a-d defining, or at least partially defining, a peripheral edge portion of the door 250.

As shown in FIG. 2B, The outer periphery 257 of the door 250 is similar in shape (e.g., rectangular) but larger than the outer periphery 255 of the door opening 216. More specifically, the door panel 250 can have a first width $W_1$ and a first height $H_1$, and as shown in FIG. 2A, the opening 216 can have a second width $W_2$ that is less than the first width $W_1$, and a second height $H_2$ that is less than the first height $H_1$. As a result, the outer periphery 257 of the door 250 can encompass the outer periphery 255 of the opening 216 when the door 250 is in the closed position. In other embodiments, the door panel 250 can have a first width $W_1$ and a first height $H_1$, and the opening 216 can have a second width $W_2$ that is less than or equal to the first width $W_1$, and a second height $H_2$ that is less than or equal to the first height $H_1$. In other embodiments, the outer periphery 257 of the door 250, or portions thereof, can at least partially extend beyond or encompass the outer periphery 255 of the opening 216 when the door 250 is in the closed position. As those of ordinary skill in the art will appreciate, in other embodiments, the door 250 and/or the opening 216 can have other shapes, such as round, oval, elliptical, square, octagonal, parallelogram, trapezoidal, etc., and/or other relative sizes without departing from the present disclosure.

In one aspect of this embodiment shown in FIG. 2A, the cabinet door 250 is pivotally attached to the door frame 253 by a plurality of hinges 252 (identified individually as a first hinge 252a and a second hinge 252b) positioned at upper and lower corner portions of the door 250, respectively. The door 250 can also include one or more spacers 251 (identified individually as a first spacer 251a and a second spacer 251b) positioned at upper and lower corner portions of the door 250, respectively, opposite the hinges 252. A first latch part 254 mounted to the door panel 250 releasably engages a second latch part 256 on the door frame 253 to hold the door in the closed position shown in FIG. 2B.

As shown in FIG. 2B, the spacers 251 and hinges 252 are shaped and sized or otherwise configured so that the door 250 is positioned in front of the opening 216, and offset from the exterior surface portions 259 of the door frame 253 a distance D when the door is in the closed position. The offset distance D defines a peripheral gap 248 extending between the door 250 and the door frame 253 around, or at least partially around, the outer periphery 257 of the door 250. In the illustrated embodiment, the offset dimension D can be from about 0.2 inch to about 2 inches, e.g., from about 0.4 inch to about 1.5 inches. More particularly, in one or more embodiments, the offset dimension D can be from about 0.6 inch to about 1.2 inches, or from about 0.7 inch to about 1 inch, or about 0.8 inch. In other embodiments, the offset dimension D can have other dimensions. In still further embodiments, the offset dimension D can vary around the outer periphery 257 of the door 250 without departing from the present disclosure. For example, in some embodiments the door 250 could be canted or angled to vary the offset dimension D around the outer periphery 257 of the door 250. In yet other embodiments, the door 250 can be offset from the opening 216 and/or the exterior surface portions 259 of the door frame 253 by other means. For example, in one embodiment the offset can be achieved by using only extended hinges on one side of the door 250 without the use of spacers on the other side of the door 250. Accordingly, the present disclosure is not limited to the particular methods and systems illustrated in the accompanying Figures for achieving a desired door gap, but extends to other suitable methods and systems for achieving such a gap.

Figure 3:
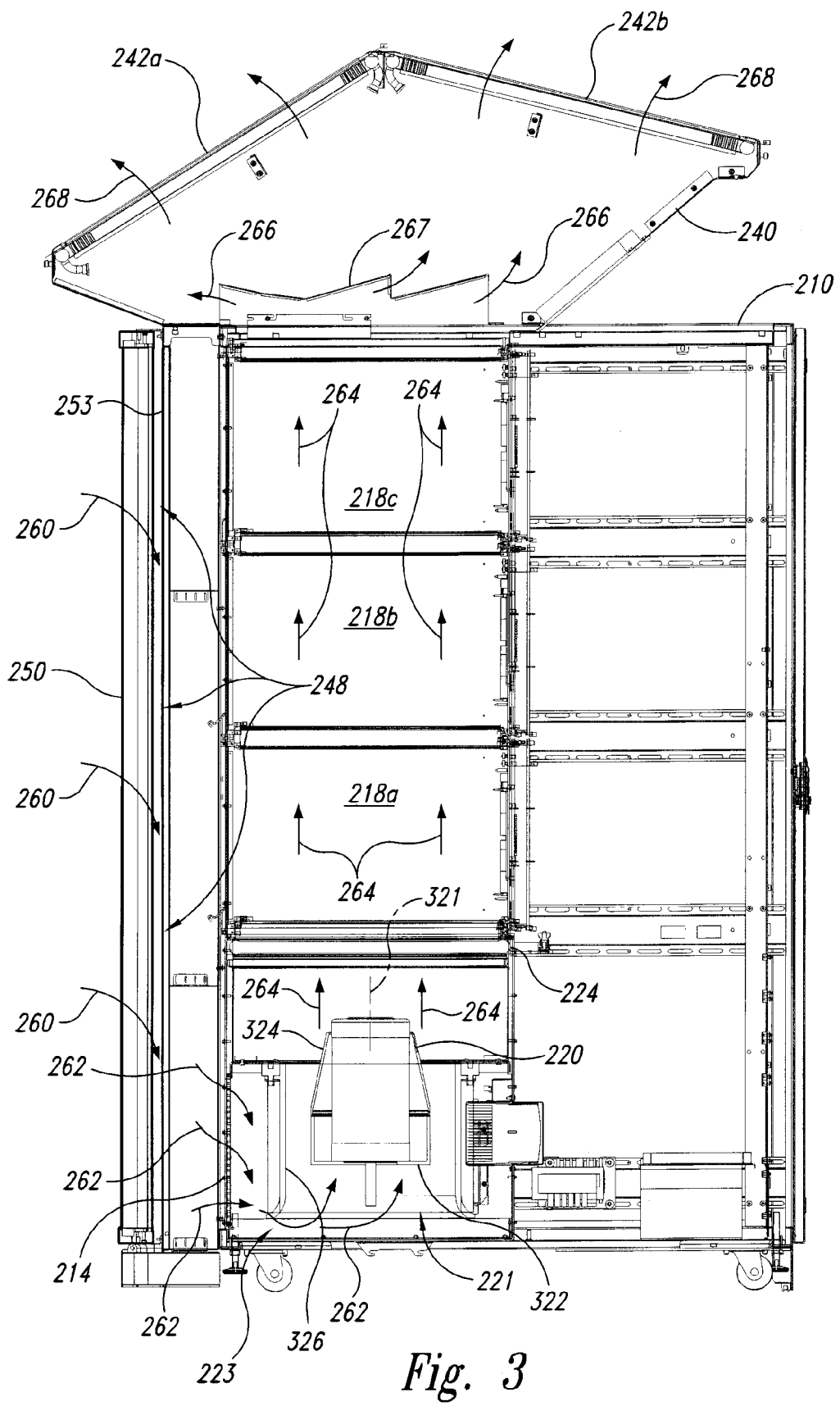
FIG. 3 is a cross-sectional, side elevation view of the computer cabinet of FIG. 2.

FIG. 3 is a cross-sectional, side elevation view of the computer cabinet 210 illustrating aspects of the air mover 220 in more detail. In the illustrated embodiment, the air mover 220 is an axial flow fan (e.g., an electric motor-driven axial flow fan) having a plurality of fan blades 322 that rotate about a central axis 321. The air mover 220 further includes a plurality of stationary vanes or stators 324 positioned upstream of the fan blades 322 to align the flow of pressurized air exiting the air mover 220. A shroud 326 is positioned around the fan blades 322.

Referring to FIGS. 3 and 2B together, when the air mover 220 is operating, air (represented by arrows 260) flows into the cabinet 210 through the peripheral gap 248 between the door panel 250 and the adjacent portions of the cabinet 210. In the illustrated embodiment, the peripheral gap 248 extends between the interior surface portions 261 of the door 250 and the adjacent exterior surface portions 259 of the door frame 253. After passing through the gap 248, the air (represented by arrows 262) flows through the access panel inlet 214, into the air mover plenum 223, and then into the air mover 220 via the intake 221. Pressurized air (represented by arrows 264) then flows out of the air mover 220, through the inlet air heat exchanger 224, and upwardly through the computer module compartments 218 to absorb heat generated by the electronic devices mounted on the computer modules 212 (the computer modules 212 have been removed from FIG. 2B for purposes of clarity). The air (represented by arrows 266) exits the third computer module compartment 218c and flows into the overhead heat exchanger 240 via the flow element 267. After collecting in the overhead heat exchanger 240, the air (represented by arrows 268) exits the overhead heat exchanger 240 and flows into the room 201 through the heat exchanging portions 242.

One advantage of the embodiment of the computer cabinet 210 described above with reference to FIGS. 2A-3, is that the cross-sectional area of the peripheral gap 248 around the door 250 is relatively large. This feature allows cooling air to flow into the computer cabinet 210 through the peripheral gap 248 with relatively low pressure losses, as compared to, for example, prior art systems that utilize sound-absorbing louvers or baffles on cooling air inlets. A further advantage of this configuration is that the door panel 250 can be positioned in the direct path of sound waves traveling outward from the air mover 220. Without wishing to be bound by theory, blocking the sound path with the offset door panel 250 in this manner can provide beneficial acoustic attenuation and noise reduction, while still providing relatively low pressure losses for incoming air.

Figure 4:
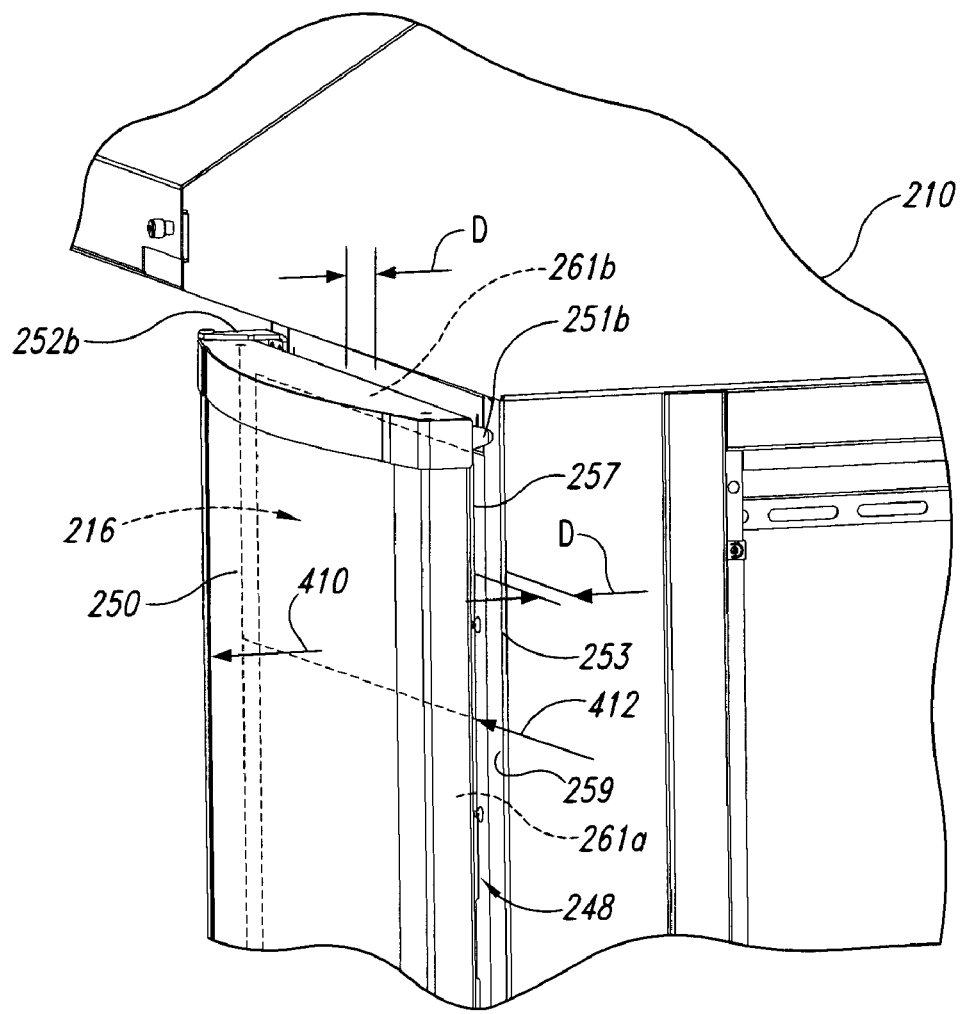
FIG. 4 is an enlarged isometric view of a portion of the cooling air intake system illustrated in FIGS. 2A-3.

FIG. 4 is an enlarged isometric view of an upper portion of the computer cabinet 210 illustrating various aspects of the offset door 250 in more detail. As this view illustrates, the door 250 is offset from the computer cabinet 210 (or more specifically, in this embodiment, from the door frame 253) the distance D in a first direction 410. The first direction 410 is perpendicular to, or at least approximately perpendicular to, the door opening 216. The peripheral gap 248 between the exterior surface portions 259 of the door frame 253 and the opposing interior surface portions 261 of the door 250 forms an airflow passageway that extends in a second direction 412. The second direction 412 is parallel to, or at least approximately parallel to, the door opening 216. Accordingly, the second direction 412 is perpendicular to, or at least approximately perpendicular to, the first direction 410. Without wishing to be bound by theory, orienting the airflow passageway in the second direction 412 causes operating noise from the air mover 220 (FIG. 3) to be deflected off the door panel 250 and make a right angle turn, or at least approximately a right angle turn, before exiting the computer cabinet 210. This indirect path can significantly reduce the ambient noise resulting from operation of the air mover 220.

Figure 5:
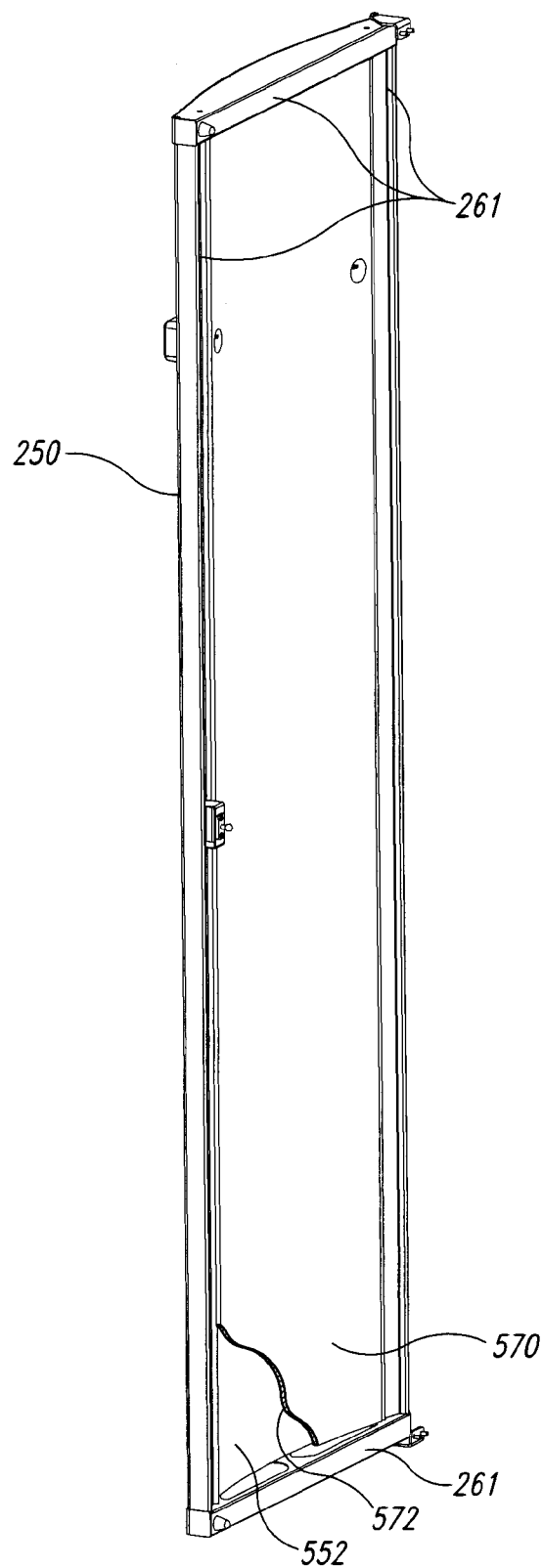
FIG. 5 is a rear isometric view of a door from the computer cabinet of FIGS. 2A-3.

FIG. 5 is a rear isometric view of the door 250 configured in accordance with an embodiment of the invention. In one aspect of this embodiment, the door 250 can include a layer of sound absorbing material 570 attached to a door panel 552. The door panel 552 can be manufactured from metallic material, such as aluminum, steel, etc.; composites; plastics; and/or other suitable structural materials known in the art. In the illustrated embodiment, the door panel 552 is curved such that it has a convex shape facing inwardly toward the computer cabinet 210. As a result, sound emitting from the cabinet 210 during operation of the air mover 220 (FIG. 2) hits the convex surface of the door 250 and is reflected back toward the cabinet 210. This can prevent or reduce noise scattering, and can reduce noise escaping from the peripheral gap 248 around the door 250 and into the surrounding room. In other embodiments, however, the door 250 can be flat and/or have other shapes without departing from the present disclosure.

In the illustrated embodiment, the sound absorbing material 570 covers, or at least approximately covers, the interior surface of the door panel 552 (i.e., the surface that faces the door opening 216 (FIG. 2)). In other embodiments, the sound absorbing material 570, or other sound insulating materials, can be attached to the exterior surface of the door panel 552 in addition to, or in place of, the sound absorbing material on the interior surface. The sound absorbing material 570 can be attached to the door panel 552 with a suitable adhesive 572. In other embodiments, the sound absorbing material 570 can be attached to the door panel 552 with fasteners and/or other suitable materials and methods known in the art. In one embodiment, the sound absorbing material 570 can include a foam, such as a PVC open cell foam. For example, the sound absorbing material 570 can include a filled, lead-free PVC open or closed cell foam referred to as SoundMat PB, provided by the Soundcoat Company of 1 Burt Drive, Deer Park, N.Y., 11729. In other embodiments, other types of sound absorbing materials can be attached to the door panel 552. In still further embodiments, the sound absorbing material 570 can be omitted from the door 250, or the door materials can be selected and/or constructed to provide sufficient sound absorption.

Figure 6:
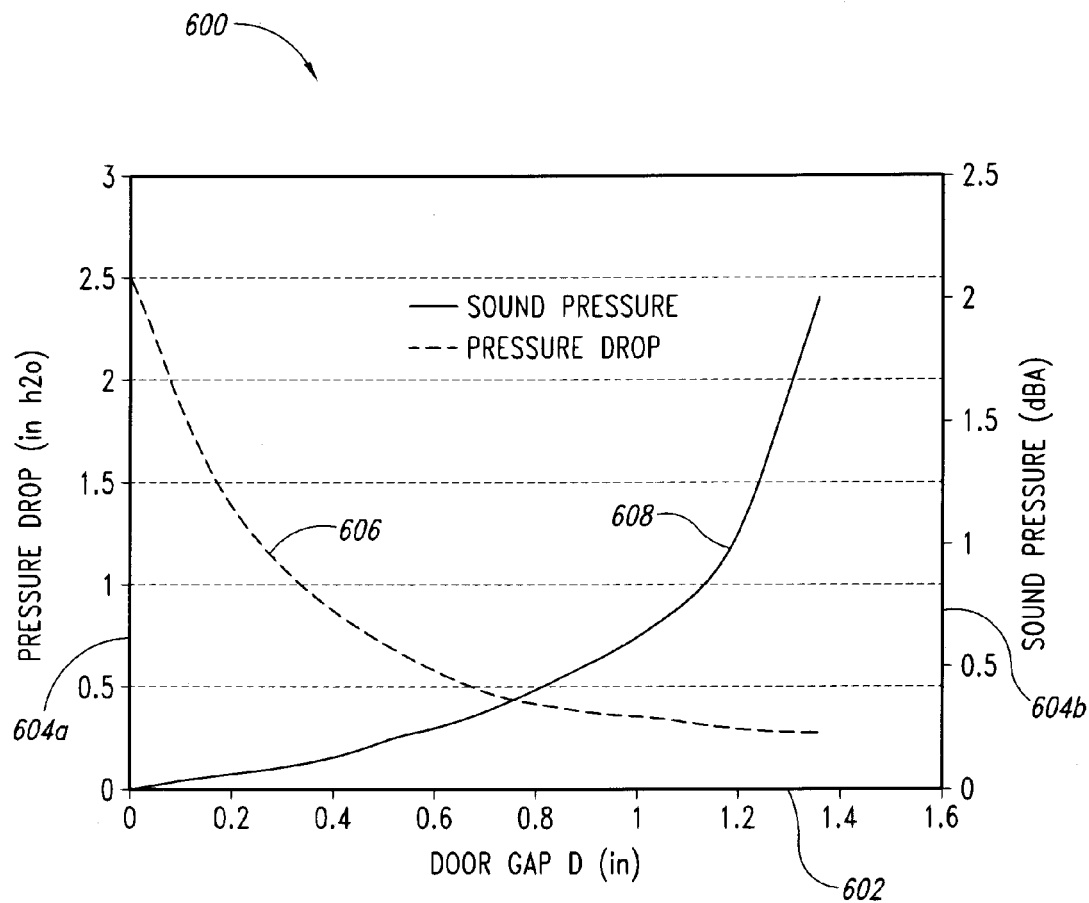
FIG. 6 is a chart illustrating airflow pressure drop and sound pressure level as a function of door panel-to-cabinet gap, in accordance with an embodiment of the invention.

FIG. 6 illustrates a chart 600 showing representative effects of door gap distance D (FIGS. 2A-4) on intake air pressure drop and sound pressure attenuation for a particular cabinet configuration. More specifically, air pressure drop across the peripheral gap 248 is measured along a first vertical axis 604a, and sound pressure from the air mover 220 is measured along a second vertical axis 604b. Door offset distance D is measured along a horizontal axis 602. As a first plot 606 illustrates, the drop in air pressure across the peripheral gap 248 favorably declines as the door offset distance D increases. As a second plot 608 illustrates, however, increasing the door offset distance D also has the negative effect of increasing the ambient sound pressure from the air mover 220. Accordingly, selecting an offset distance D where the first plot 606 and the second plot 608 cross, or selecting an offset distance D at least proximate to this point, can provide a suitable design solution whereby the air pressure drop is relatively low and the sound pressure attenuation is relatively high. In other embodiments, other door offset distances can be used.

Figure 7:
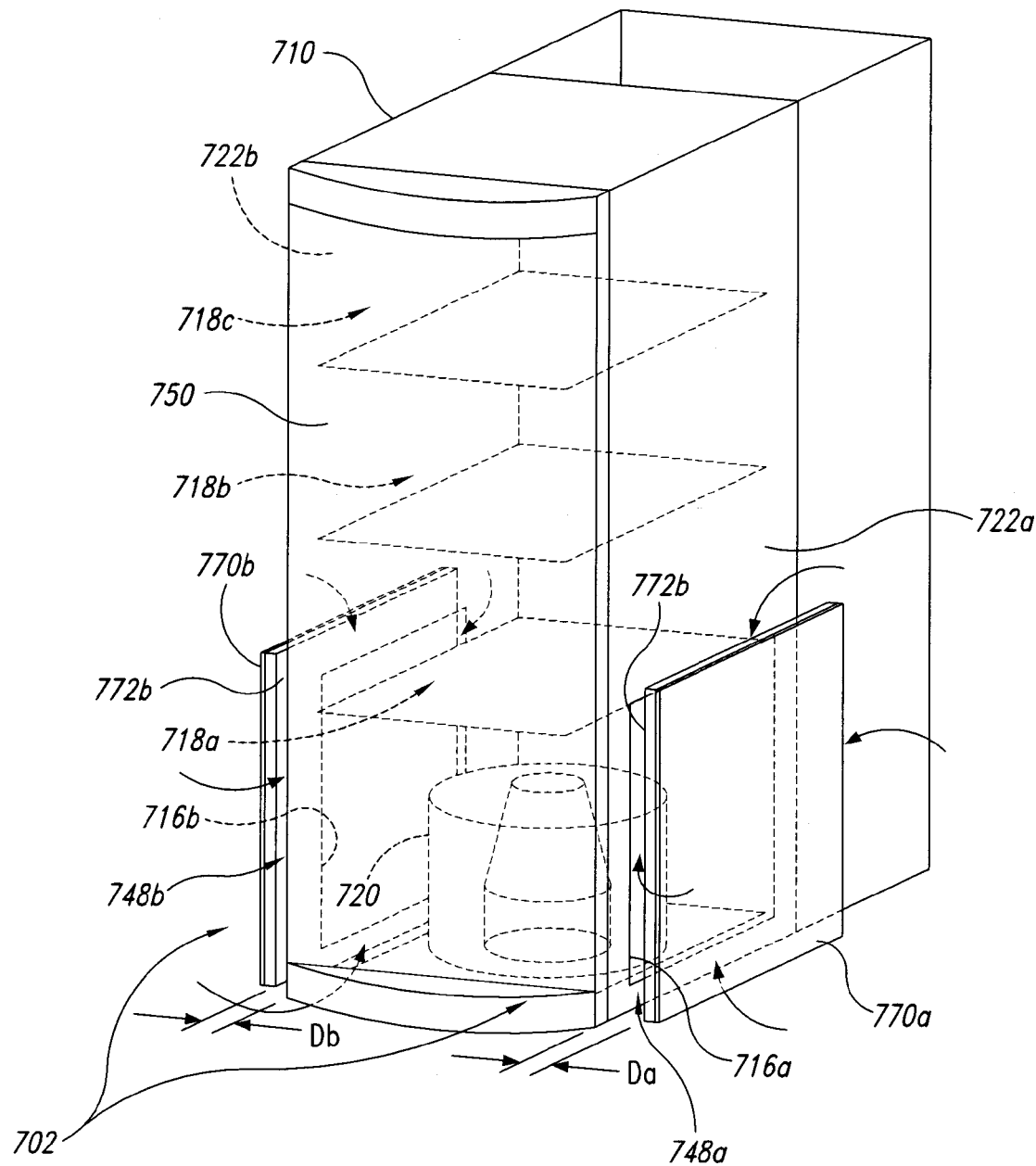
FIG. 7 is an isometric view illustrating a computer cabinet having a cooling air intake system configured in accordance with another embodiment of the invention.

FIG. 7 is an isometric view of a computer cabinet 710 having an airflow intake system 702 configured in accordance with another embodiment of the invention. Many features of the computer cabinet 710 are at least generally similar in structure and function to the computer cabinet 210 described in detail above with reference to FIGS. 2A-5. For example, the computer cabinet 710 can include a plurality of computer module compartments 718a-c vertically arranged above an air mover 720. In this particular embodiment, however, the computer cabinet 710 includes a door 750 that is closed against the computer cabinet 710 in a conventional manner (e.g., there is little or no gap around the door). Moreover, the door 750 does not include an air inlet for the air mover 720. Instead, the computer cabinet 710 includes a first opening 716a in a first sidewall 722a, and a second opening 716b in an opposite second sidewall 722b. A first panel 770a is offset from the first sidewall 722a by a distance Da, and a second panel 770b is offset from the second sidewall 722b by a distance Db. Each of the panels 770 can include sound absorbing material 772 positioned in front of the corresponding opening 716. In operation, air is drawn into the computer cabinet 710 through a first peripheral gap 748a extending between the first panel 770a and the first sidewall 722a, and through a second peripheral gap 748b extending between the second panel 770b and the second sidewall 722b. As discussed above with reference to FIGS. 2A-6, the airflow passageways created by the peripheral gaps 748 can provide relatively low air pressure drops for incoming air, while providing relatively high absorption of sound pressure from the air mover 720.

From the foregoing, it will be appreciated that specific embodiments of the invention have been described herein for purposes of illustration, but that various modifications may be made without deviating from the spirit and scope of the invention. Aspects of the invention described in the context of particular embodiments may be combined or eliminated in other embodiments. Furthermore, while advantages associated with certain embodiments of the invention have been described in the context of those embodiments, other embodiments may also exhibit such advantages, and not all embodiments need necessarily exhibit such advantages to fall within the scope of the invention. Accordingly, the invention is not limited, except as by the appended claims.

I/We claim:

1. A computer system comprising:
   a cabinet having an opening to an interior portion thereof;
   a panel positioned in front of the opening and hingeably attached to the cabinet, wherein the panel is pivotally movable from a first position in which the panel is at least generally parallel to the opening to a second position in which the panel is spaced apart from the opening to provide access to the interior portion of the cabinet, and wherein the panel is offset from the opening to define a peripheral gap between the panel and the cabinet when the panel is parallel to the opening in the first position;
   a plurality of computer modules positioned in the interior portion of the cabinet; and
   an air mover positioned in the interior portion of the cabinet, wherein operation of the air mover draws cooling air into the cabinet through the peripheral gap between the panel and the cabinet and moves the cooling air through the cabinet and past the computer modules.

2. The computer system of claim 1 wherein the cabinet opening has a first width and the panel has a second width greater than the first width.

3. The computer system of claim 1 wherein the opening has a first periphery and the panel has a second periphery that encompasses the first periphery.

4. The computer system of claim 1 wherein the opening has a first shape and the panel has a second shape that is generally similar to the first shape and larger than the first shape.

5. The computer system of claim 1, further comprising a layer of acoustic insulation attached to the panel.

6. The computer system of claim 1 wherein the peripheral gap between the panel and the cabinet is generally constant when the panel is in the first position and fully closed against the cabinet.

7. The computer system of claim 1 wherein the cabinet includes a first side wall spaced apart from a second sidewall, and a back wall extending between the first and second side walls, wherein the opening is opposite the back wall, and wherein the air mover is set back from the opening.

8. The computer system of claim 1 wherein the cabinet includes a first opening edge portion opposite a second opening edge portion, wherein the panel includes a first panel edge portion opposite a second panel edge portion, and wherein the peripheral gap includes a first gap portion extending between the first panel edge portion and the first opening edge portion, and a second gap portion extending between the second panel edge portion and the second opening edge portion.

9. A computer system comprising:
   a cabinet having an opening to an interior portion thereof, wherein the cabinet includes a first opening edge portion spaced apart from a second opening edge portion;
   a panel positioned in front of the opening and at least partially offset from the opening to define a peripheral gap between the panel and the cabinet, wherein the panel includes a first panel edge portion spaced apart from a second panel edge portion;
   a plurality of computer modules positioned in the interior portion of the cabinet;
   an air mover positioned in the interior portion of the cabinet, wherein operation of the air mover draws cooling air into the cabinet through the peripheral gap between the panel and the cabinet and moves the cooling air through the cabinet and past the computer modules; and
   a hinge extending between the first panel edge portion and the first opening edge portion, wherein the at least one hinge permits the panel to rotate away from the opening to an open position to provide access to the interior portion of the cabinet, and wherein the at least one hinge further permits the panel to rotate toward the opening to a closed position in which the panel is positioned in front of the opening and at least generally parallel to the opening; and
   a spacer attached to at least one of the second panel edge portion and the second opening edge portion, wherein the spacer extends between the second panel edge portion and the second opening edge portion to control the gap when the panel is in the closed position.

10. A computer system comprising:
    a cabinet having:
       a plurality of side wall portions forming an enclosure;
       a plurality of edge portions forming an opening in the enclosure;
       a door shaped and sized to occlude the opening, wherein the door is hingeably attached to the enclosure at least proximate to one of the edge portions, wherein the door is offset from the enclosure in a first direction perpendicular to the opening when the door is in a closed position, and wherein an air flow passage extends between the door and the enclosure in a second direction perpendicular to the first direction when the door is in the closed position;
    a plurality of computer modules positioned in the cabinet;
    means for moving air positioned in the cabinet adjacent to the opening, wherein operation of the means for moving air draws air into the cabinet through the airflow passage between the door and the enclosure, and directs the air through the computer modules.

11. The computer system of claim 10 wherein the opening in the enclosure defines a plane, wherein the first direction is perpendicular to the plane, and wherein the second direction is parallel to the plane.

12. The computer system of claim 10 wherein the means for moving air is offset from the opening in a third direction opposite to the first direction.

13. The computer system of claim 10 wherein the opening has a first width dimension and the door has a second width dimension that is greater than the first width dimension.

14. The computer system of claim 10 wherein the opening has a first width dimension and a first height dimension, and wherein the door has a second width dimension that is greater than the first width dimension and a second height dimension that is greater than the first height dimension.

15. A super computer system comprising:
- a plurality of computer cabinets arranged in a bank, wherein each of the computer cabinets includes:
  - a plurality of vertically-arranged computer module compartments, wherein each of the computer modules compartments carries a plurality of computer modules;
  - a fan positioned beneath the computer module compartments;
  - a plurality of side walls forming an enclosure around the computer module compartments and the fan, the side walls further forming an opening that provides access to the computer module compartments, the opening having a first periphery; and
  - a door positioned in front of the opening, the door having a second periphery that extends around the first periphery, wherein the door is movable from a closed position in which the door is parallel to the opening to an open position in which the door provides access to the computer modules through the opening, and wherein the door is offset from the enclosure to form a peripheral gap between the door and the enclosure that permits air from outside the cabinet to flow into the fan when the door is parallel to the opening in the closed position.

16. The super computer system of claim 15 wherein each of the computer cabinets further includes a layer of sound absorbing material attached to an interior surface of the door and facing the opening when the door is in the closed position.

17. A super computer system comprising:
- a plurality of computer cabinets arranged in a bank, wherein each of the computer cabinets includes:
  - a plurality of vertically-arranged computer module compartments, wherein each of the computer modules compartments carries a plurality of computer modules;
  - a fan positioned beneath the computer module compartments;
  - a plurality of side walls forming an enclosure around the computer module compartments and the fan, the side walls further forming an opening that provides access to the computer module compartments, the opening having a first periphery; and
  - a door positioned in front of the opening, the door having a second periphery that extends around the first periphery to form a gap between the door and the enclosure that permits air from outside the cabinet to flow into the fan.
  - wherein the fan is positioned behind an inlet screen that permits air from outside the cabinet to flow into the fan, wherein the door is offset from the opening in a first direction perpendicular to the inlet screen when the door is in a closed position, and wherein the gap between the door and the enclosure forms an air flow passage that extends in a second direction perpendicular to the first direction when the door is in the closed position.

18. A method for cooling a plurality of computer modules in a computer cabinet, the method comprising:
- moving the computer modules through an opening in the computer cabinet to install the computer modules in the cabinet;
- positioning an air mover in the computer cabinet;
- positioning a panel in front of the opening and spaced apart from the opening to provide a perimeter gap between the panel and the cabinet; and
- operating the air mover to draw air into the computer cabinet through the perimeter gap; and
- moving the air past the computer modules.

19. The method of claim 18, further comprising hingeably attaching the panel to the cabinet so that the panel can be pivotally moved to provide access to the computer modules.

20. The method of claim 18, further comprising attaching a layer of acoustic insulation to the panel.

* * * * *

UNITED STATES PATENT AND TRADEMARK OFFICE
CERTIFICATE OF CORRECTION

| | |
|---|---|
| PATENT NO. | : 7,903,403 B2 |
| APPLICATION NO. | : 12/253692 |
| DATED | : March 8, 2011 |
| INVENTOR(S) | : Wade J. Doll et al. |

It is certified that error appears in the above-identified patent and that said Letters Patent is hereby corrected as shown below:

On page 3, under item (56), "Other Publications", in column 2, line 26, delete "Scottsdale, AA," and insert -- Scottsdale, AZ, --, therefor.

In column 3, line 56, delete "The" and insert -- the --, therefor.

In column 10, line 12, in Claim 17, delete "fan." and insert -- fan, --, therefor.

Signed and Sealed this
Tenth Day of May, 2011

David J. Kappos
*Director of the United States Patent and Trademark Office*